United States Patent [19]
Gregerson et al.

[11] Patent Number: 5,944,194
[45] Date of Patent: Aug. 31, 1999

[54] 300 MM MICROENVIRONMENT POD WITH DOOR ON SIDE

[75] Inventors: Barry Gregerson, Deephaven, Minn.; Gary Gallagher, Colorado Springs, Colo.; Brian Wiseman, Oakdale, Minn.

[73] Assignee: Empak, Inc., Chanhassen, Minn.

[21] Appl. No.: 08/913,260

[22] PCT Filed: Oct. 13, 1995

[86] PCT No.: PCT/US95/12516

§ 371 Date: Sep. 10, 1997

§ 102(e) Date: Sep. 10, 1997

[87] PCT Pub. No.: WO97/13710

PCT Pub. Date: Apr. 17, 1997

[51] Int. Cl.[6] ............................................. B65D 85/90
[52] U.S. Cl. .......................................... 206/711; 206/454
[58] Field of Search ........................... 206/454, 710–712, 206/832, 833; 211/41.18

[56] References Cited

U.S. PATENT DOCUMENTS

| | | | |
|---|---|---|---|
| 4,450,960 | 5/1984 | Johnson | 206/334 |
| 4,557,382 | 12/1985 | Johnson | 206/444 |
| 4,721,207 | 1/1988 | Kikuchi | 206/334 |
| 4,747,488 | 5/1988 | Kikuchi | 206/444 |
| 5,390,811 | 2/1995 | Ogino et al. | 220/326 |
| 5,399,398 | 3/1995 | Toshimitsu et al. | 428/35.7 |
| 5,472,086 | 12/1995 | Holliday et al. | 206/711 |

*Primary Examiner*—Jim Foster
*Attorney, Agent, or Firm*—Nikolai, Mersereau & Dietz

[57] ABSTRACT

A container for creating a microenvironment is disclosed. The container includes a shell, a door and a plurality of supports having a unique design which are used to securely retain items, such as silicon wafers, in a spaced apart parallel relationship. The supports are removable. An electrical path is provided to ground the supports. Kinematic coupling structures are also provided for positioning the container on a surface so as to, for example, properly align the door with the port of a wafer processing tool.

21 Claims, 11 Drawing Sheets

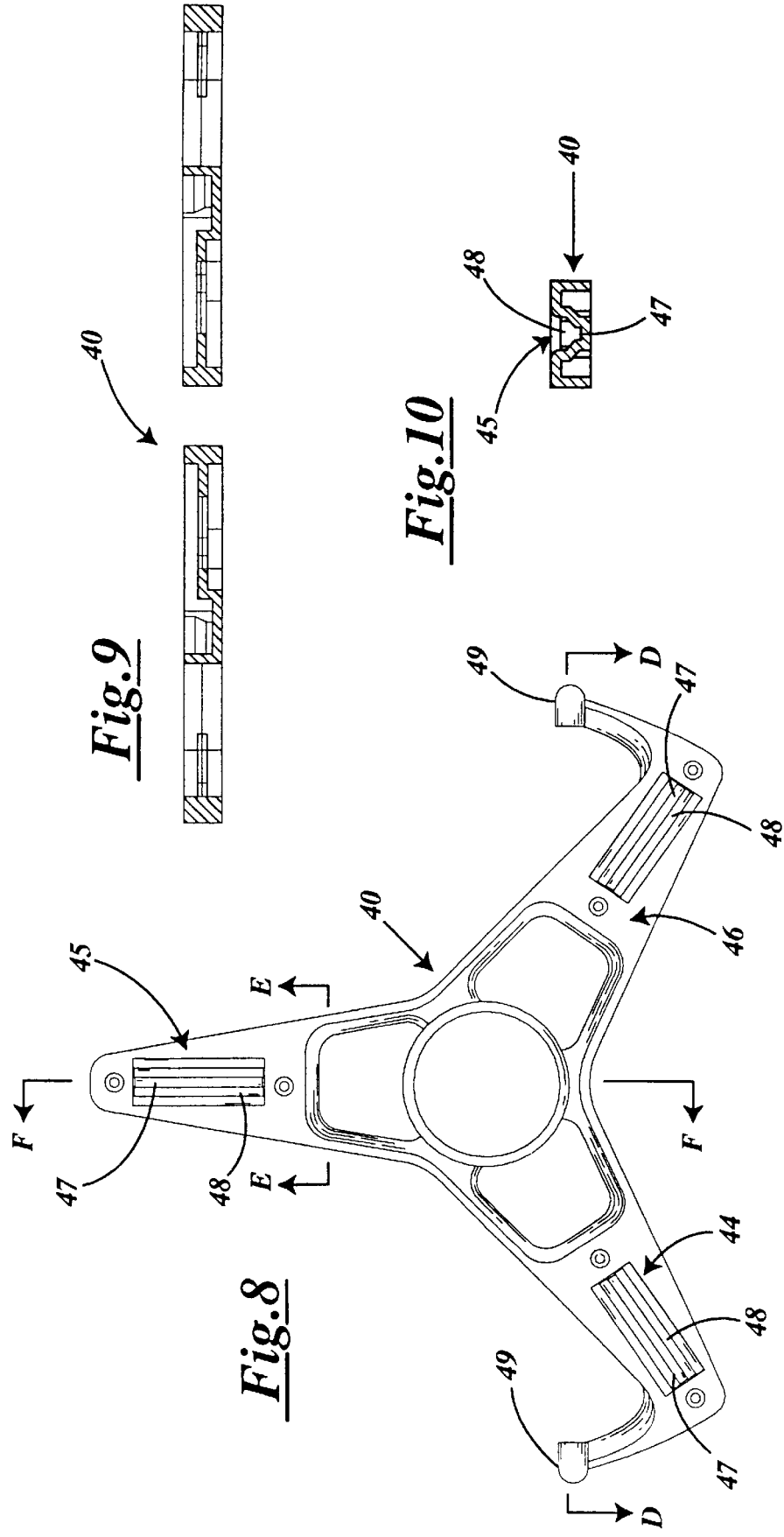

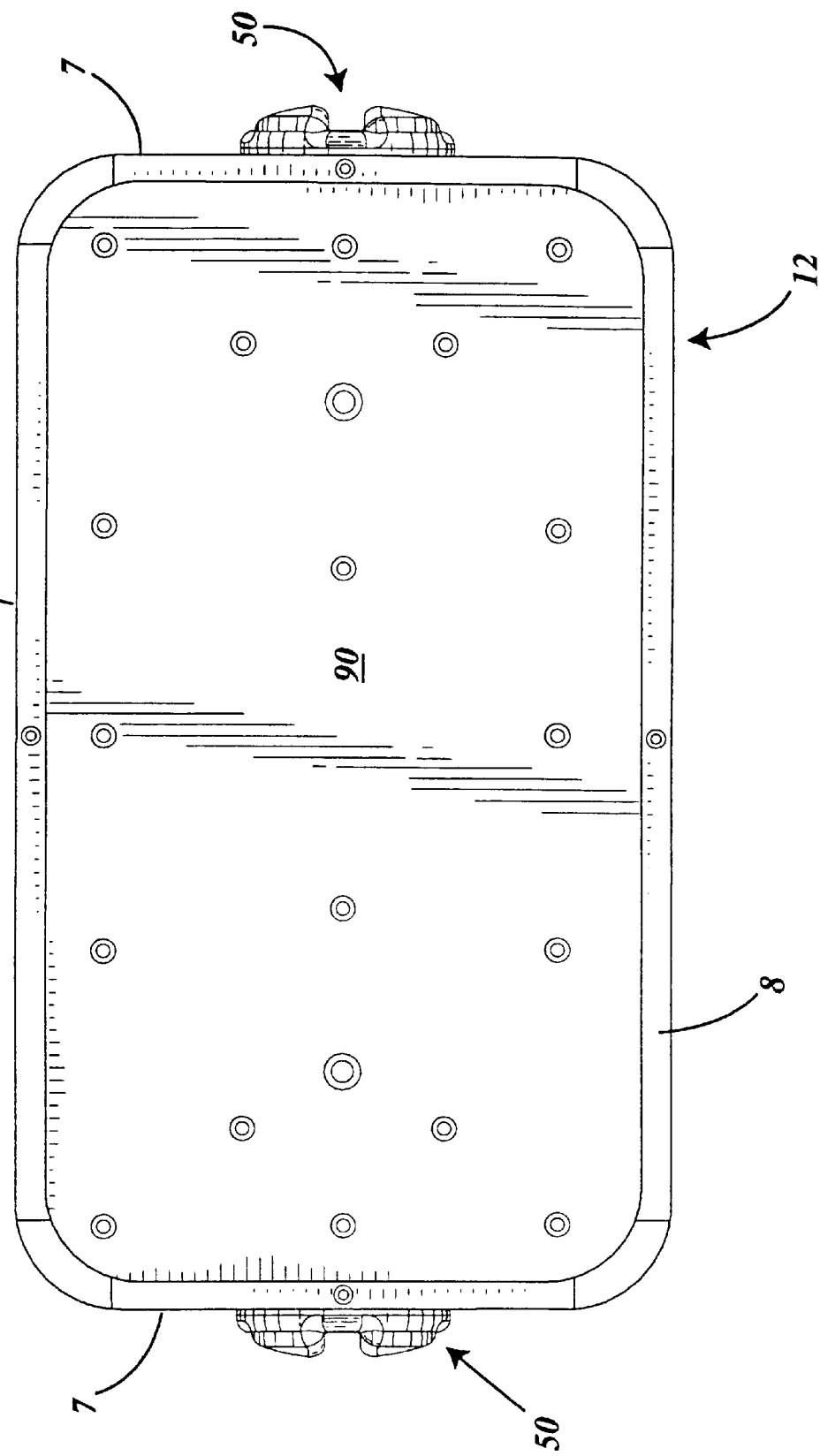

300 MM MICROENVIRONMENT POD WITH DOOR ON SIDE

BACKGROUND OF THE INVENTION

I. Field of the Invention

The present invention relates generally to a package for an item. More particularly, the present invention relates to a package specifically designed to isolate from contamination materials used in the manufacture of electronic semiconductor components and circuits. Such packages are particularly well suited for substrates, wafers, memory disks, photomasks, flat panel displays, liquid crystal displays, and the like.

II. Description of the Prior Art

Various containers have been used for centuries to transport items from one place to another. Such containers have, for example, been used to provide a way to confine items in a space for efficient storage. Such containers also provide an easy way of handling items. Another important function provided by packages and containers is protection.

Substrates used in the manufacture of semiconductor circuits, rigid memory disks, photomasks, liquid crystal displays, and flat panel displays can be extremely sensitive. Effective steps must be taken to protect such items from damage by moisture, particles, static electricity, or the like. Steps must also be taken to protect the articles from damage caused by vibration and shock within the package. Similarly, steps must be taken to prevent outgassing and the generation of particles which will occur if the items stored in the package scrape, rub, or impact various surfaces within the package.

This combination of problems makes designing a suitable package very difficult. Such problems are only compounded by the environment in which such packages are typically used.

Suitable packaging for use in connection with the storage and transport of wafers, memory disks, photomasks, liquid crystal display panels and flat panel displays tend to be very expensive. It is highly desirable that such packaging be reusable and have durable construction. Also, such packaging must be capable of being readily and thoroughly cleaned. Finally, when the package is used in connection with the manufacture of semiconductors, it must be readily adaptable for use with robotic handling and automated manufacturing equipment.

Empak, Inc., has made a number of suitable packages in the past for use in the processing and transport of such items. Examples of such packages are shown in U.S. Pat. No. 5,273,159 and U.S. Pat. No. 5,423,422. While such package designs have proven to be highly effective in conjunction with smaller items, the designs, for a variety of reasons, are not suitable for storage and transport of items having outside dimensions in the range of 300 mm or more.

SUMMARY OF THE INVENTION

Suitable containers for use with wafers, photomasks, memory disks, liquid crystal display panels and flat panel displays must meet several important design criteria. They must be light weight to make manual and robotic handling tasks easier. The internal volume of the container should be minimized to reduce storage space requirement and increase storage density. The height of the container should be minimized to allow for improved stacking of the containers. The amount of polymer surface area surrounding the items during transport and storage should be minimized to reduce inorganic and organic contaminants as well as the negative affects of outgassing of the polymer.

Containers built in accordance with the present invention meet the design criteria set forth above. Such containers also provide several other unique advantages. First, tolerance build-up is minimized by means of locating the container about item center lines, thereby increasing the positional accuracy of the items stored in such containers. This enhances effective insertion and removal of the items from the container using robotic equipment. Second, the containers reduce the risk of damage caused by static electricity. This is achieved in one preferred embodiment by providing a conductive path to ground from static dissipative internal item supports to the container's external kinematic coupling plate which is used to position the container on various pieces of equipment. Third, the containers of the present invention are designed to be wet-cleaned with or without disassembly. Fourth, since the containers of the present invention can have an integral design which does not require a separate carrier, the containers can remain associated with a specific lot of items. This enables workers in the factory to better track a lot and, therefore, reduces the chance of processing errors. Fifth, the integral design, by eliminating the need for a separate cassette, minimizes the number of packaging components required to be kept in inventory and the space such components take up. Sixth, the integral design eliminates the need to accurately position a removable cassette in the container and lock it in place. Finally, the integral design can be manufactured using fewer and smaller parts, thereby reducing manufacturing costs.

It is therefore an object of the present invention to provide an isolation container which will provide protection against contamination by particles or moisture.

Another object of the present invention to provide a container which protects the items stored therein from damage due to shock and vibration and from damage due to the item scraping, rubbing, or impacting various surfaces of the container.

A further object of the invention is to provide such a container which is reusable and easily cleaned.

Still another object of the invention is to provide such a container which has interior structures which are not susceptible to wear or generation of particles which could contaminate the contents of the package.

Yet another object of the invention is to provide such a container which is highly effective when used in conjunction with automated processing or handling equipment.

Still another object of the invention is to provide a structure which can easily be handled, manipulated and transported by humans.

These and other objects are accomplished by providing a container having a shell with an opening for insertion and removal of the items, a door designed to effectively seal the opening, a plurality of item-retaining structures within the shell which securely hold the items and retain them in spaced apart relation from each other, a kinematic coupler plate to assist in aligning the container with the port of equipment used to process the items in a factory, and ergonomically designed handles which can be effectively used either manually or through robotic means. In order to reduce contamination by particles inside the container, the item supports are made of a high-temperature resistant, conductive material. The item supports are also grounded to the exterior of the container as described in detail below. The entire container is structured to maximize the support and protection offered to the items, maximize ease of handling, and reduce, to the extent possible, the height and weight of the container.

A better understanding of the invention will be deserved from reading the description of the preferred embodiment set forth below in conjunction with the drawings. While the description and drawings specifically relate to a microenvironment pod for silicon wafers, the invention described is also well suited for other applications, such as the storage and transport of photomasks, rigid memory disks, liquid crystal display panels, flat panel displays, or the like.

BRIEF DESCRIPTION OF THE DRAWINGS

FIG. 8 is a drawing of the kinematic coupler plate;

FIG. 9 is a cross-section of the kinematic coupler plate through line D—D in FIG. 8;

FIG. 10 is a cross-section of the kinematic coupler plate through line E—E in FIG. 8;

FIG. 15 is a plan view of the door of the container in the closed position with respect to the container's shell;

DESCRIPTION OF THE PREFERRED EMBODIMENT

Figure 1:
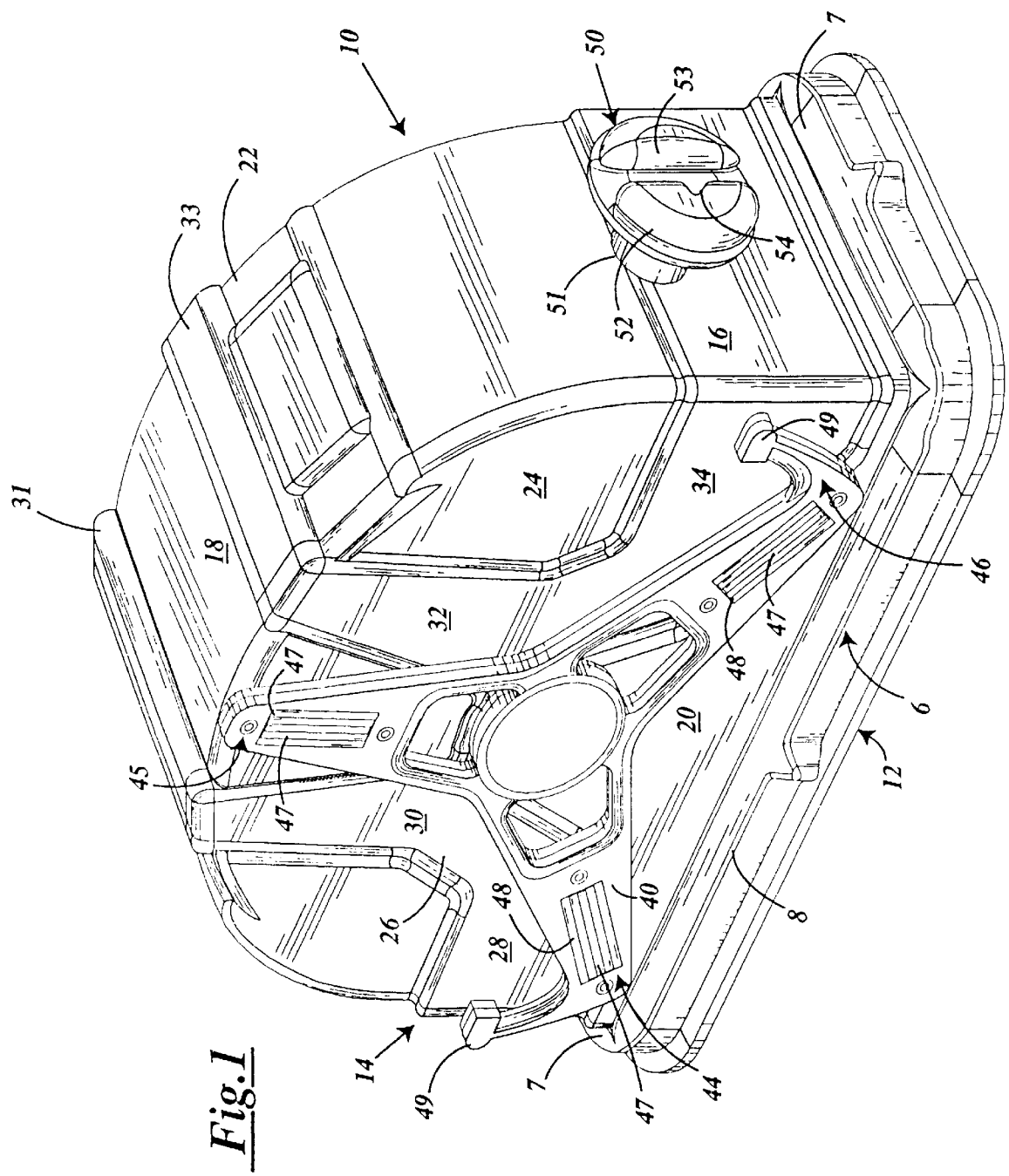
FIG. 1 is a perspective view of a container shell made in accordance with the invention.
Figure 2:
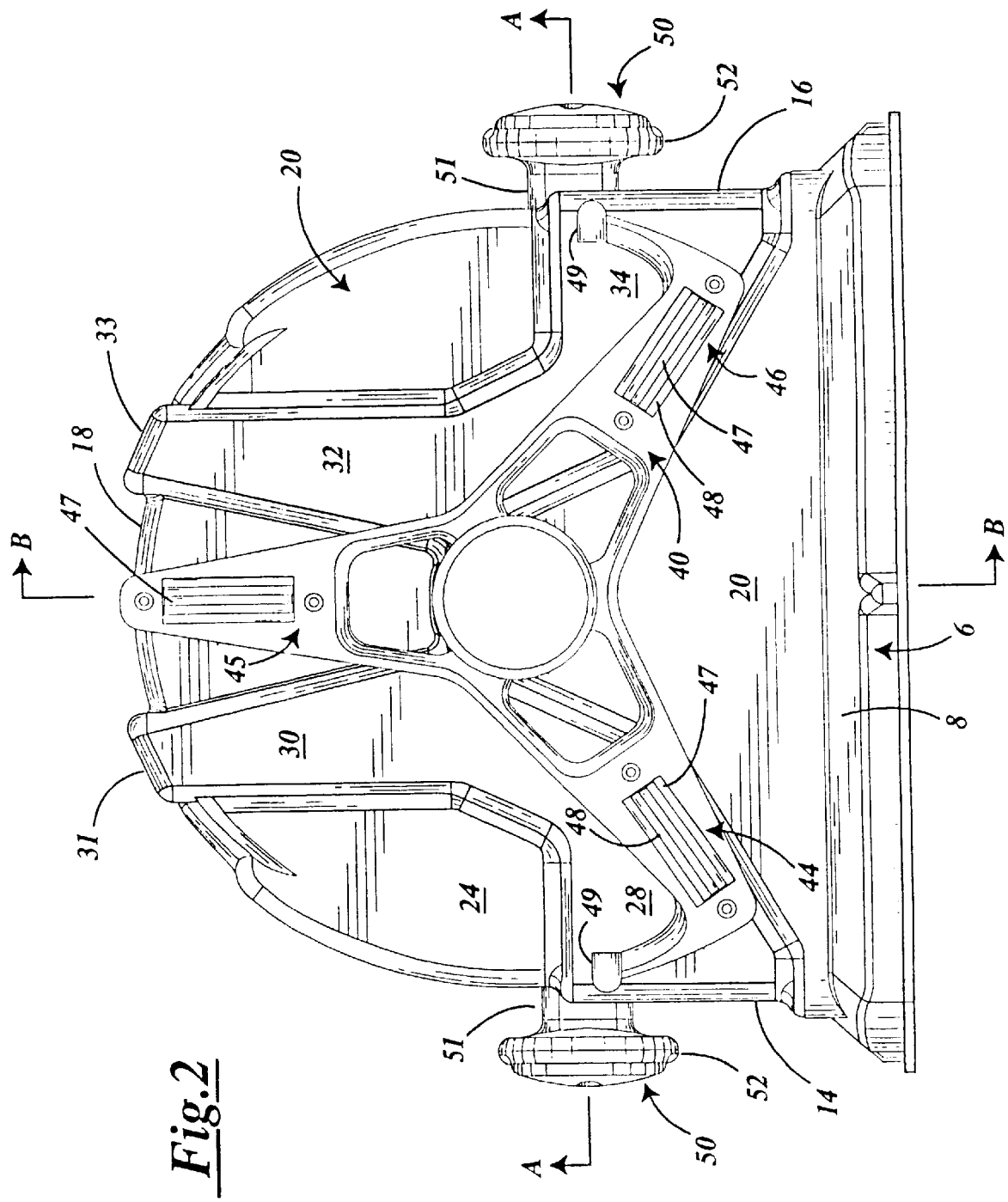
FIG. 2 is a top plan view of the container shell.

As shown in FIG. 1, the container of the present invention has an exterior shell 10. The exterior shell 10 has six sides 12, 14, 16, 18, 20 and 22.

Side 12 comprises a door frame 6 having a pair of opposing end portions 7 and a pair of side portions 8. Sides 14 and 16 of the exterior shell 10 are defined generally by straight walls extending from the opposite end portions 7 of the door frame 6. Wall 18 extends between walls 14 and 16 and is in the shape of a partial cylinder. The radius of curvature of wall 18 is generally the same as the radius of curvature of the wafer to be stored in the container. Top and bottom walls 20 and 22 complete the shell. Walls 20 and 22 have a generally flat surface 24 and a reinforcement member 26 projecting outwardly from the flat surface 24. Reinforcement member 26 prevents warpage of the container and especially walls 20 and 22. Reinforcement members 26 have four legs 28, 30, 32 and 34. Extending across wall 18 between the two legs 30 is a cross-brace 31. In a similar fashion, cross-brace 33 extends between the two legs 32. Cross-braces 31 and 33 can be used to support the exterior shell 10 on a flat surface if it is positioned so that wall 18 is down.

Also shown in FIG. 1 is a kinematic coupling plate 40. FIGS. 1–5 and 8–11 show the structure of the kinematic coupling plate in greater detail. This plate is secured to wall 20 by a plurality of mounting posts 42 (see FIG. 5). Three separate coupling grooves 44, 45 and 46 are formed into the kinematic coupling plate 40. These grooves are designed to mate with posts on the processing equipment (not shown) to align the access opening 8 with a port on the processing equipment. As best shown in FIG. 10, the grooves 44, 45 and 46 are Y-shaped to include a narrow, deeper, center channel 47 and wider, less deep, upper channel 48 which serves to catch and direct the alignment post of the processing equipment into the center channel 47 to achieve proper alignment. Proper alignment results when the three alignment posts on the processing equipment (not shown) mate with the center channel 47 of the grooves 44, 45 and 46.

The kinematic coupling plate 40 is made of a conductive material. It is also designed to include a pair of screw receiving members 49. As explained below, members 49 each receive a screw which is used to electrically couple the kinematic coupling plate 40 to the wafer supports 60 located inside the container. This electrical coupling creates a path by which the wafer supports can be grounded to dissipate any electrical charge on the wafers or wafer supports and, thus, prevent damage to the wafers caused by static electricity.

FIG. 1 also shows a pair of handles 50. These handles are located at the center of gravity of the container. The handles are ergonomically designed so they are easily gripped from a variety of angles by the human hand. The design of the handles 50 allows them to be effectively grasped by robotic handling equipment.

More specifically, each handle 50 includes a support column 51 which joins the handle 50 to the shell 10 and a wider gripping member 52. The gripping member 52 has an exterior shape which permits it to be comfortably grasped by a human hand. The gripping member 52 also has a recessed channel formed in its end. Channel 53 is generally straight, but includes a notch 54. The channel 53 and notch 54 are present to be engaged by gripping members of a robotic arm. As such, the container is designed for easy, efficient and safe handling by humans or robots.

Figure 3:
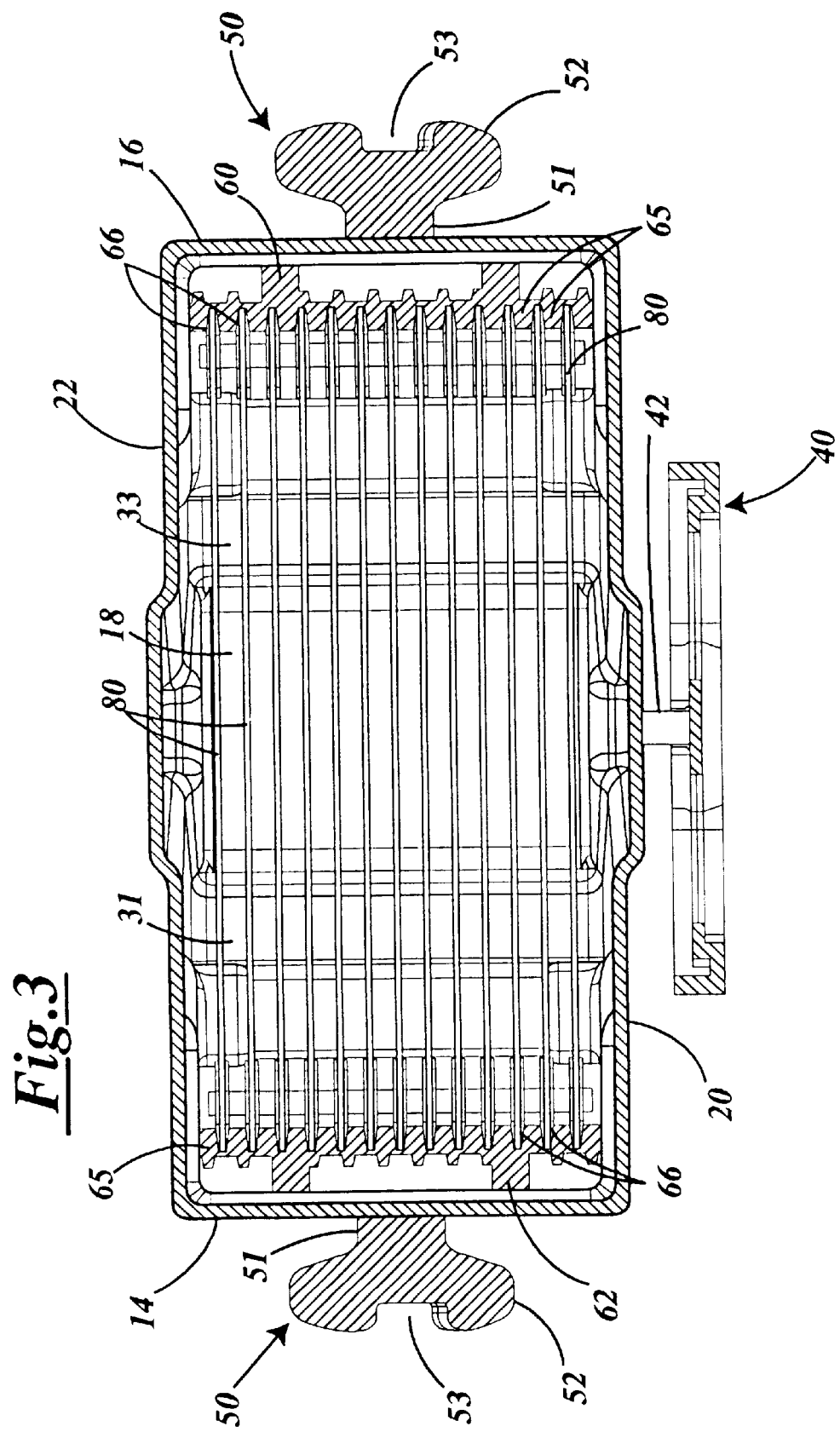
FIG. 3 is a cross-section of the container through line A—A in FIG. 2.
Figure 4:
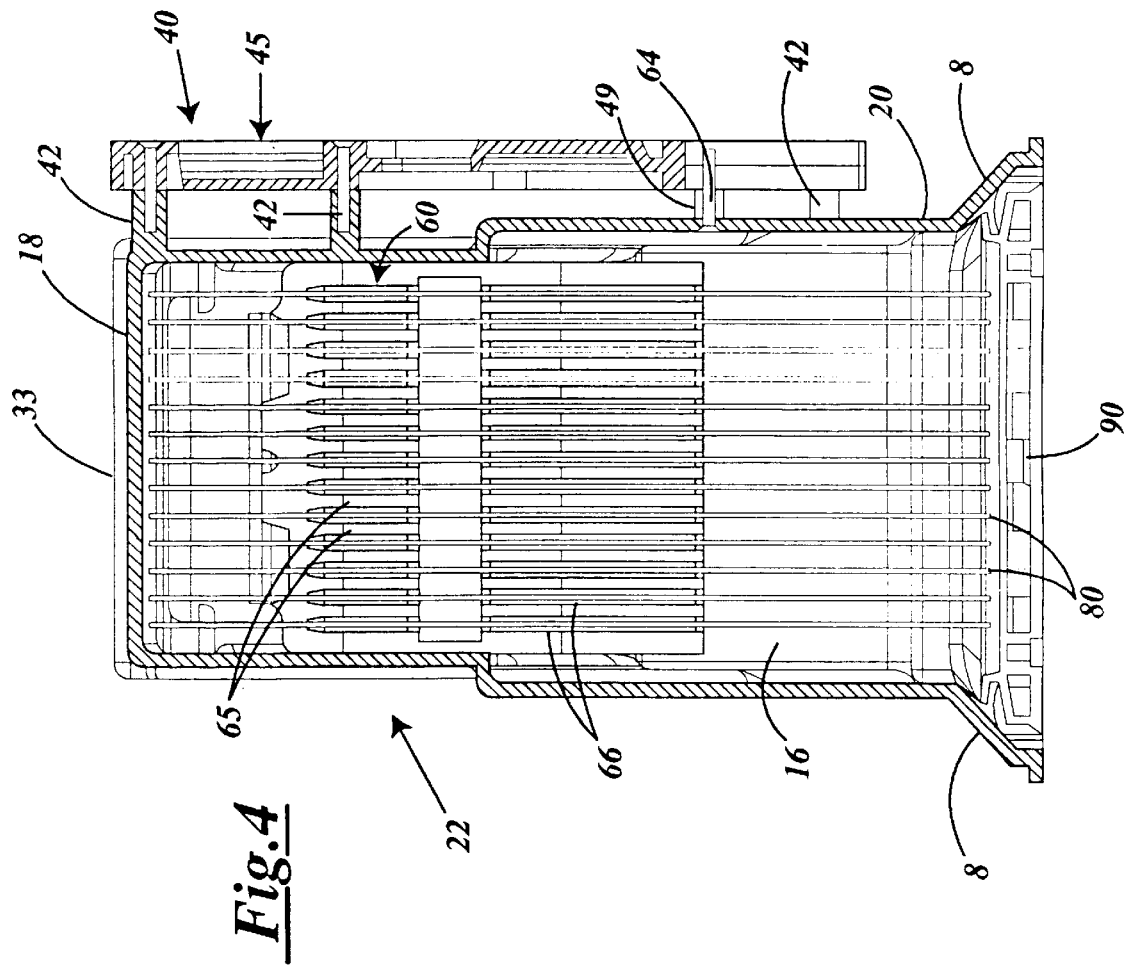
FIG. 4 is a cross-section of the container through line B—B in FIG. 2.
Figure 5:
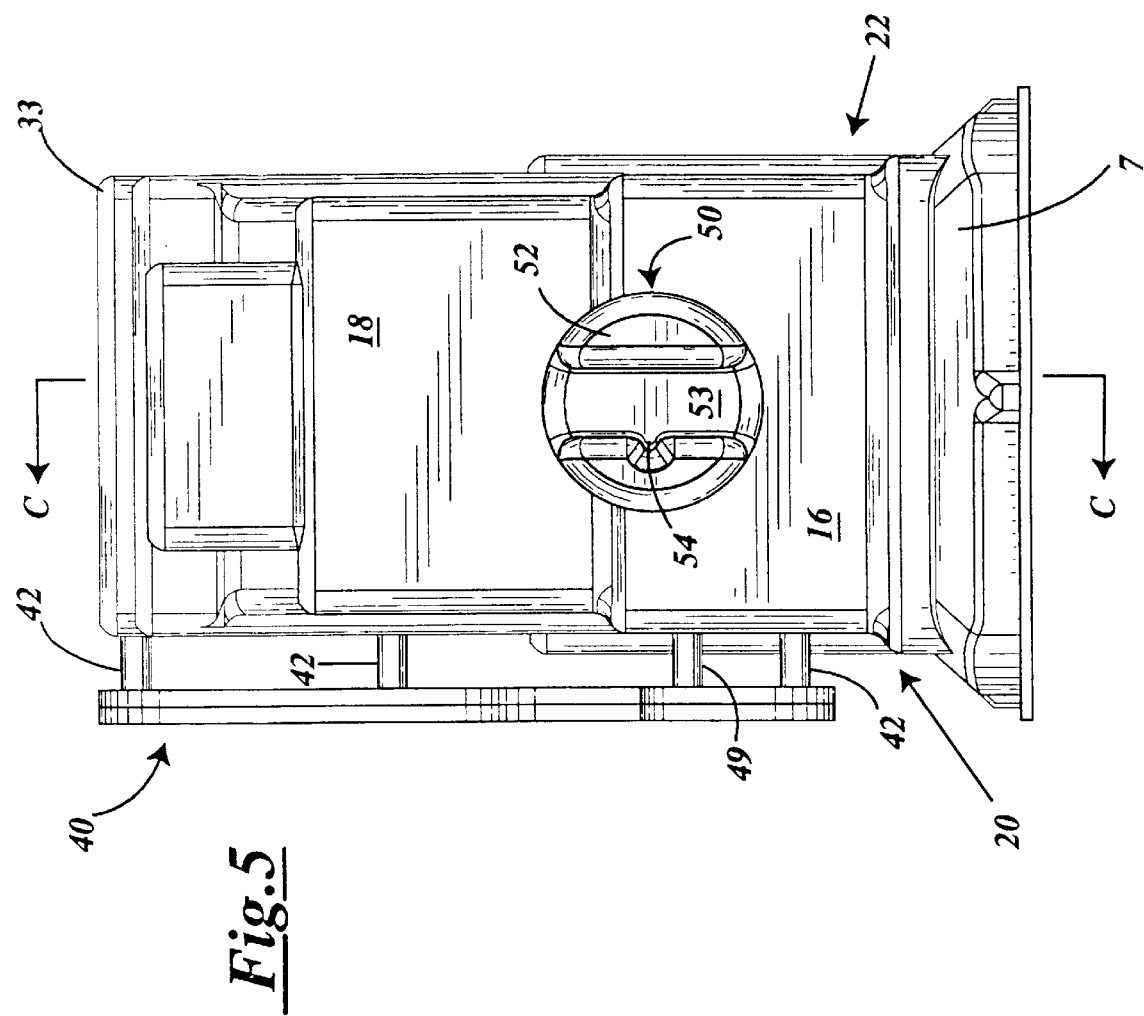
FIG. 5 is a side view of the container incorporating the present invention.
Figure 6:
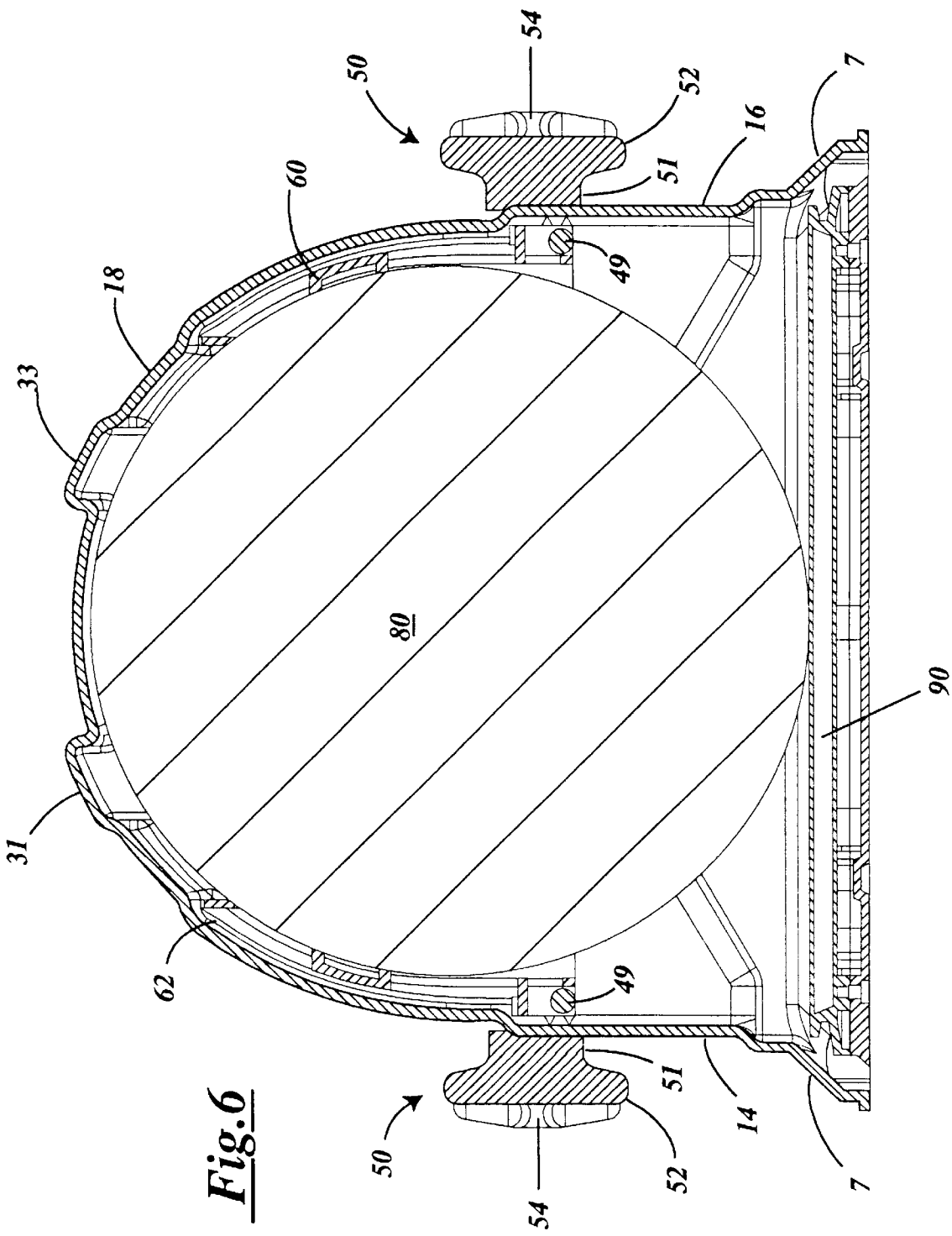
FIG. 6 is a cross-section of the container through line C—C in FIG. 5.
Figure 7:
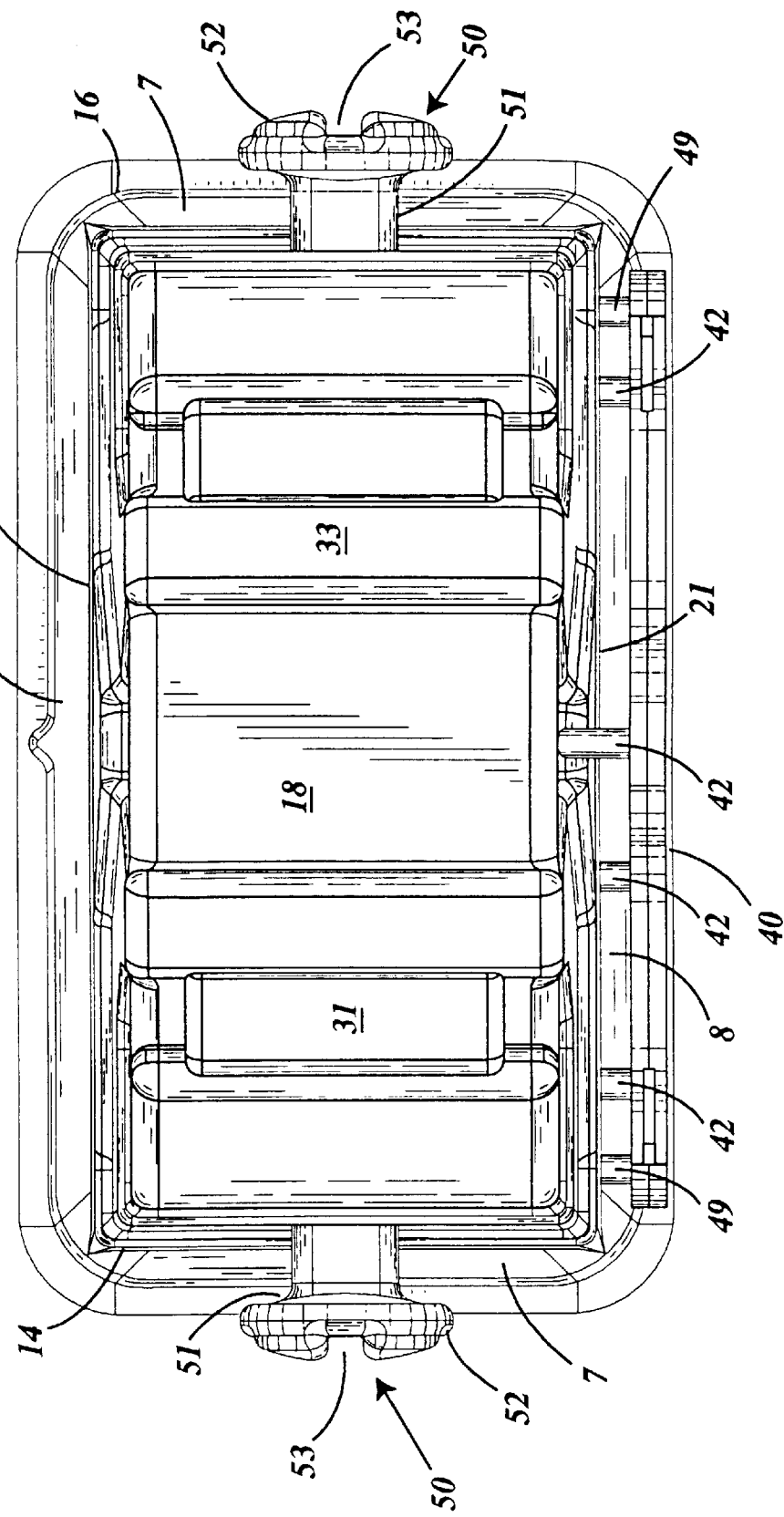
FIG. 7 is a view of the container from the side opposite the door.
Figure 14:
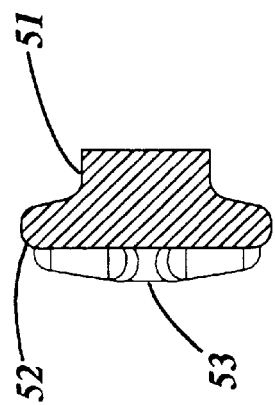
FIG. 14 is a cross-section of the handle through line G—G in FIG. 13.
Figure 13:
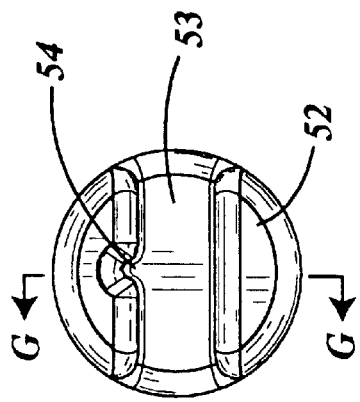
FIG. 13 is an end view of the handle.
Figure 12:
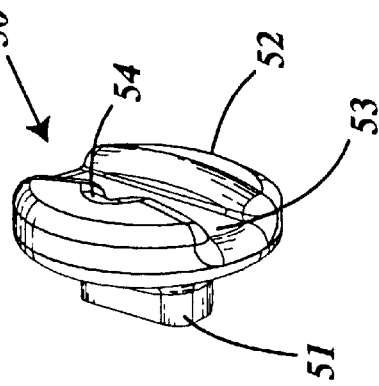
FIG. 12 is a prospective view of one of the ergonomic handles used in the design.
Figure 11:
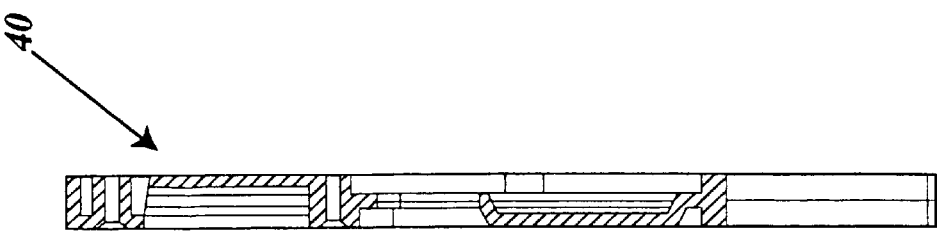
FIG. 11 is a cross section of the kinematic coupler plate through line F—F in FIG. 8.

FIGS. 3, 4 and 6 show some of the interior structure of the shell 10 not visible in FIG. 1. For example, FIGS. 3 and 4 show wafer supports 60 and 62 which cooperate to hold up to thirteen wafers 80. Typically, twelve of the wafers 80 are product wafers and one is a test wafer. The wafer supports 60 and 62 are all made of a material which is electrically conductive and resistant to high temperatures. The wafer supports 60 and 62, as shown, each have fourteen wafer dividers 65. A wafer edge receiving channel 66 is formed between each pair of dividers 65. The channels on wafer support 60 cooperate with the channels on wafer support 62 to hold the wafers 80 in a parallel spaced apart registration as shown in FIGS. 3 and 4. Those skilled in the art will recognize that the wafer supports 60 and 62 can be modified to hold more wafers (for example, 25) or fewer wafers (for example, 7) without deviating from the present invention. Likewise, the wafer supports 60 and 62 could also be dimensioned to retain something other than a wafer or to retain wafers of differing sizes.

In the preferred embodiment shown in the drawings, each of the channels 66 is especially formed to retain 300 mm wafers. The back side of each channel is curved in the circumferential direction (e.g. the direction of the circumference of the wafer 80) and in the transverse direction (e.g., the direction across the thickness of the wafer 80). The curvature of the backside of each channel 66 is approximately the same radius of curvature as the outside edge of the 300 mm wafers 80, in both the circumferential and transverse directions. Providing the same radius of curvature along the circumferential direction presents contact between the channel's back side and the edge of the wafer 80 along an arc rather than merely at a point.

Figure 17:
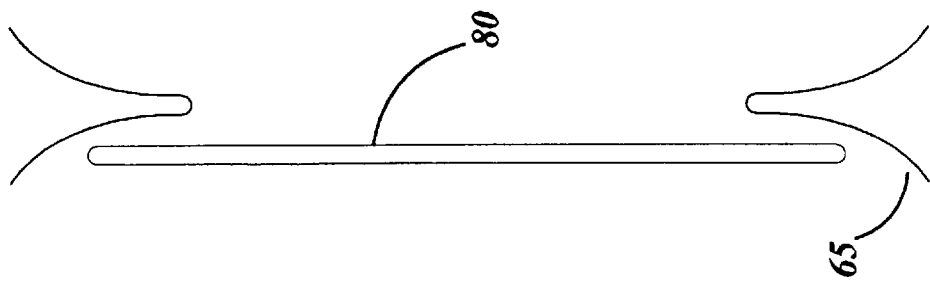
FIG. 17 is a cross section showing two opposing dividers and a wafer.

Significant advantages are provided by shaping the wafer divider 65 as shown in FIG. 17. The wafer dividers have a continuously varying slope such that gravity helps center the wafer 80 in the middle of the carrier. With this style of wafer divider 65, the wafer always rests on a portion of the wafer divider that has a finite slope, so edge contact is guaranteed. Further, if for any reason the wafer is moved off of dead center, one edge is raised more quickly than the other edge is lowered. Thus, for carriers where the wafers are transported horizontally, gravity may be used to help center the wafer with this support. Once centered, the wafer's vertical location is precisely defined. As the carrier is moved from one location to the next, small levels of vibration may help to center the wafer in the carrier, thus improving the horizontal positional accuracy of the wafers as well as the vertical positional accuracy.

An additional benefit of the wafer design, as shown in FIG. 17, is that it presents the lowest possible cross-section for a given support strength. The divider 65 presents an area of interference for the wafer 80 as it is inserted into and removed from the carrier. Thin dividers are preferred because there is less chance of a wafer 80 hitting the divider and causing particles to be generated. On the other hand, the divider 65 must be thick enough to support the wafer 80 and to avoid deflection over the life of the container. In light of these conflicting requirements, the divider design has a continuously varying angle as shown in FIG. 17.

In the preferred embodiment, a pair of screws 64 are provided. One of the screws 64 is used to form a conductive path between the wafer support 60 and the conductive kinematic coupling plate 40. The other screw 64 is used to provide a conductive path between wafer support 62 and the kinematic coupling plate 40. This arrangement provides the advantage of grounding the wafer supports 60 and 62 via screws 64 and the kinematic coupling plate 40 so that the wafer supports 60 and 62 have no electrical charge. The walls of the shell 10 are not grounded and have a slightly negative charge which will cause particles in the container to migrate and attach themselves to the walls of the container where they can do no harm to the wafers. So that the screws 64 do not ground the exterior shell 10, it may be desirable to line the bores in the shell 10 through which the screws 64 pass with an insulative material.

To close the access opening 8 of the shell 10, a door 90 is provided. The door 90 is shaped and dimensioned to fit within the door frame 6. When in place, the door engages the door frame 6 to seal the container. Likewise, the outer edge of door frame 6 can be used to form a seal around the access opening 8 between the door frame 6 and the port of a tool used to process semiconductor wafers 80. The risk of contamination is reduced if such a seal is created before the door 90 is opened. When such a seal is created, the door 90 can safely be opened so that the wafers 80 can be withdrawn from the shell 10, through the port and into the tool for processing without substantial risk of contamination. Typically, a plurality of latches (not shown) to hold the door in the closed position will be provided. Also, a flexible gasket or ring can be provided between the door 90 and frame 6 to ensure complete sealing between the door 90 and frame 6.

Figure 16:
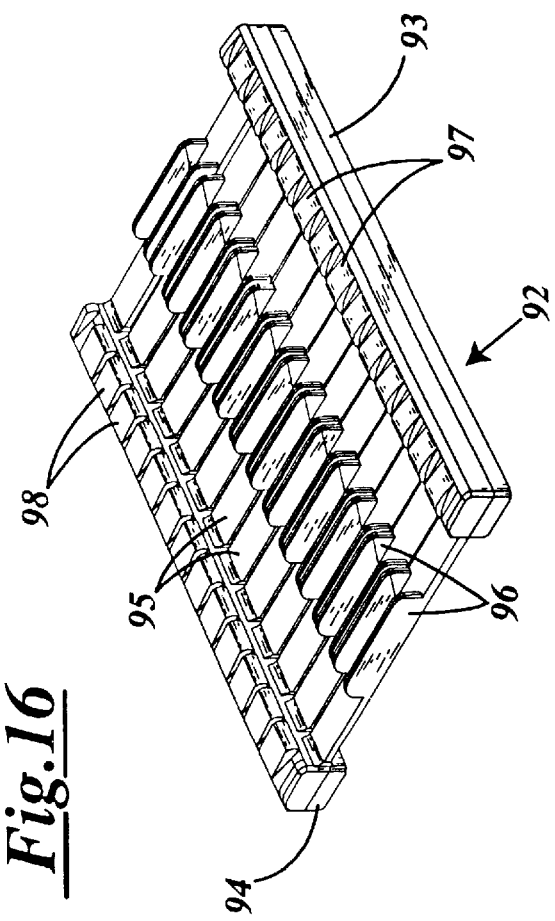
FIG. 16 is a perspective view of a cushion which can be attached to the inside surface of the door to help support and retain items stored in the container in the proper position during storage and transport.

The door 90 can be provided with a wafer cushion 92. As shown in FIG. 16, cushion 92 has a pair of rigid rails 93 and 94 and a plurality of deformable cross-members 95. Thirteen deformable cross-members 95 are shown in FIG. 16. Each cross-member 95 has a pair of dividers 96. Each divider 96 is aligned with a divider 97 on rigid rail 93 and a divider 98 on rigid rail 94. Thus, as the door 90 is closed, the wafers 80 engage the channels formed by the dividers 96, 97 and 98. Cross-members 95 will deform until the edges of wafers 80 also engage the rigid rails 93 and 94. Even if the wafers 80 are jarred during transport, contact with and support by cushion 92 is not lost because of the deformable cross-members 95.

The inclusion of such a wafer cushion 92 on the door 90 yields three areas of support for the wafers 80, thereby reducing movement and vibration of the wafers 80 during transport. Supporting the wafers 80 in three areas reduces damage to the wafers due to scraping, rubbing or impacting surfaces within the container. It also limits generation of particles due to such scraping, rubbing or impacting. Finally, means can be provided on the exterior door for kinematically coupling the door 90 to another surface. This can be a series of three grooves (not shown) similar to those shown in kinematic coupling plate 40 which mate with projections on the surface or three projections on the door 90 which mate with grooves on the surface.

Although the present invention has been illustrated and described with reference to the preferred embodiment thereof, the invention may also be used in conjunction with the transport and storage of liquid crystal displays, flat panel displays, photomasks, rigid memory disks, substrates, and the like. Also, various components of the invention may be constructed so that they are removable and replaceable to extend the life of the container. This is certainly true of the wafer supports 60 and 62 and wafer cushion 92 which can be removed and replaced with supports or cushions more ideally suited for other items to be held in the container. It should be understood, therefore, that the illustrations and descriptions provided herein are not intended to be limiting and that numerous modifications can be made within the scope of this invention and the claims set forth below.

What is claimed is:

1. A container for creating a microenvironment which protects items stored therein from damage, said container including:
    (a) a shell having an opening for insertion and removal of items from said shell, said shell made of a material which inherently possess a slightly negative electrical charge;
    (b) a pair of supports which cooperate to retain a plurality of items stored in the container in a parallel, spaced apart position with respect to each other;
    (c) a door for sealing said opening of said shell to prevent contamination of the items stored in said shell; and
    (d) means for creating an electrical path through which such supports are grounded so that particles within the shell are drawn away from said items and supports and toward the shell of said container.

2. The container of claim 1, wherein said items stored in the container are semiconductor wafers.

3. The container of claim 1 further including a pair of handles located on opposite sides of the container's center of gravity.

4. The container of claim 3 wherein each of said handles has a groove including an alignment notch so that the handle can be securely gripped by a robot.

5. The container of claim 1 further including a kinematic coupling plate secured to the exterior of said shell by a plurality of posts, said kinematic coupling plate having three alignment grooves each of said alignment grooves having a cross section which is generally a Y-shape.

6. The container of claim 5 wherein said alignment grooves of said kinematic coupling plate are used to align the container door with the port of a tool used to process semiconductor wafers so that a seal is created around the shell's opening and the tool's port before the container's door is opened and the wafers are withdrawn from the shell, through the port, and into the tool for processing.

7. The container of claim 1 further including a kinematic coupling plate secured to the exterior of the shell, said kinematic coupling plate being made of an electrically conductive material.

8. The container of claim 7 wherein said means for creating an electrical path through which the supports are grounded includes an electrically conductive connection between each of said supports and said kinematic coupling plate.

9. The container of claim 1 wherein said door includes means on its exterior surface for coupling said door to another surface.

10. The container of claim 1 wherein each of said supports is releasably secured to the shell so that such supports can be removed for cleaning or replacement.

11. The container of claim 2 wherein said supports have a plurality of channels, each of said channels having a backside which is curved in the circumferential direction.

12. The container of claim 11 wherein the radius of curvature of the backside of said channels in the circumferential direction is generally the same as the radius of curvature in the circumferential direction of said wafers.

13. The container of claim 2 wherein each of said pair of supports include a plurality of wafer dividers, each of said wafer dividers having a continuously varying slope to help support one of said semiconductor wafers.

14. A container for creating a microenvironment which protects items stored therein from damage, said container including:
   (a) a shell having an opening for insertion and removal of items from said shell;
   (b) a pair of supports which cooperate to retain a plurality of items stored in the container in a parallel, spaced apart position with respect to each other, each of said supports having a plurality of channels, each of said channels having a backside, at least a portion of which is curved in the circumferential direction;
   (c) a door for sealing said opening of said shell to prevent contamination of the items stored in said shell; and
   (d) means for kinematically coupling said container to another surface.

15. The container of claim 14 wherein the curved portion of the backside of each channel has a radius of curvature in the circumferential direction which is generally the same as the radius of curvature in the circumferential direction of the items to be stored.

16. The container of claim 14 wherein said supports are releasably secured to said shell.

17. The container of claim 14 further including means for providing an electrical path through which said supports are electrically grounded so that particles within the shell are drawn away from said items and supports and toward the shell of said container.

18. The container of claim 14 wherein said means for kinematically coupling said container to said surface includes at least three grooves on said container which each mate with separate projections on said surface.

19. The container of claim 14 wherein said means for kinematically coupling said container to said surface includes at least three projections on said container with each mating with separate grooves on the surface.

20. The container of claim 14 wherein said door has a cushion on its interior surface which assists said pair of supports to reduce movement and vibration of items stored in the container during transport.

21. The container of claim 14 wherein each of said pair of supports have a plurality of dividers, each divider shaped to have a continuously varying slope to help support a wafer.

\* \* \* \* \*